US012615734B2

(12) United States Patent
Huang et al.

(10) Patent No.: US 12,615,734 B2
(45) Date of Patent: Apr. 28, 2026

(54) COOLING PIPE AND COOLING ASSEMBLY AND ELECTRONIC DEVICE INCLUDING THE SAME

(71) Applicant: WISTRON CORP., New Taipei City (TW)

(72) Inventors: Hsien-Yi Huang, New Taipei City (TW); Guang Zong Li, New Taipei City (TW); Chih Lun Chin, New Taipei City (TW); Che Hao Lee, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 244 days.

(21) Appl. No.: 18/310,572

(22) Filed: May 2, 2023

(65) Prior Publication Data

US 2024/0237269 A1      Jul. 11, 2024

(30) Foreign Application Priority Data

Jan. 11, 2023      (TW) ................................. 112101144

(51) Int. Cl.
*H05K 7/20* (2006.01)

(52) U.S. Cl.
CPC ..... *H05K 7/20145* (2013.01); *H05K 7/20154* (2013.01); *H05K 7/2039* (2013.01)

(58) Field of Classification Search
CPC .......... H05K 7/20145; H05K 7/20154; H05K 7/2039; H05K 7/20772; H05K 7/20; H05K 7/20272; H05K 7/20409; G06F 1/20
See application file for complete search history.

(56) References Cited

U.S. PATENT DOCUMENTS

| | | | |
|---|---|---|---|
| 8,627,567 B2 | 1/2014 | Seo | |
| 9,233,439 B2 | 1/2016 | Seo | |
| 9,245,820 B2 * | 1/2016 | Goldrian | ............... H01L 23/473 |

(Continued)

FOREIGN PATENT DOCUMENTS

| | | |
|---|---|---|
| CN | 209592257 U | 11/2019 |
| CN | 108364922 B | 5/2021 |
| TW | 201033577 A | 9/2010 |

OTHER PUBLICATIONS

TW Office Action dated Jul. 14, 2023 in Taiwan application No. 112101144.

(Continued)

*Primary Examiner* — Stephen S Sul
(74) *Attorney, Agent, or Firm* — McClure, Qualey & Rodack, LLP

(57) ABSTRACT

A cooling assembly is configured for at least one electronic module. The cooling assembly includes at least one thermally conductive plate and at least one cooling pipe. The thermally conductive plate is configured to be attached on one surface of the electronic module. The cooling pipe is configured to be in thermal contact with one side of the thermally conductive plate located farther away from the electronic module. The cooling pipe comprises a pipe wall, and the pipe wall surrounds and forms a fluid channel. The pipe wall of the at least one cooling pipe has a thermally conductive characteristic, and the pipe wall of the at least one cooling pipe is elastically deformable in response to a pressure variation in the fluid channel.

13 Claims, 10 Drawing Sheets

(56) References Cited

U.S. PATENT DOCUMENTS

| | | | | |
|---|---|---|---|---|
| 10,582,645 | B1* | 3/2020 | Kufahl | H05K 7/20772 |
| 2004/0125565 | A1* | 7/2004 | Chen | H01L 23/3737 |
| | | | | 257/E23.107 |
| 2008/0106868 | A1* | 5/2008 | Hoss | H01L 23/3737 |
| | | | | 257/E23.102 |
| 2009/0204271 | A1* | 8/2009 | Lepschi | B01L 7/52 |
| | | | | 62/3.2 |
| 2013/0194745 | A1* | 8/2013 | Meijer | G06F 1/20 |
| | | | | 361/679.47 |
| 2014/0102662 | A1* | 4/2014 | Grama | F28D 20/023 |
| | | | | 165/10 |
| 2014/0183957 | A1* | 7/2014 | Duchesneau | F01K 13/006 |
| | | | | 307/64 |
| 2015/0136361 | A1* | 5/2015 | Gregory | F24D 3/146 |
| | | | | 165/104.19 |
| 2015/0233588 | A1* | 8/2015 | Betts | F28D 7/106 |
| | | | | 62/271 |
| 2017/0290194 | A1* | 10/2017 | Mittal | H10N 30/204 |
| 2018/0063998 | A1* | 3/2018 | Aoki | G06F 1/203 |
| 2019/0230808 | A1* | 7/2019 | Ditri | H05K 7/20672 |
| 2020/0101477 | A1* | 4/2020 | Fuller | B28C 7/128 |
| 2020/0211922 | A1 | 7/2020 | Chun | |
| 2020/0337182 | A1* | 10/2020 | Kanai | H05K 7/20772 |
| 2021/0167724 | A1* | 6/2021 | Anderson | H05K 7/20945 |
| 2023/0284377 | A1* | 9/2023 | Zhou | H05K 7/20927 |
| | | | | 361/699 |
| 2024/0077918 | A1* | 3/2024 | Holland | H05K 7/20145 |
| 2024/0114649 | A1* | 4/2024 | Chigullapalli | H05K 7/20272 |

OTHER PUBLICATIONS

TW Office Action dated May 28, 2024 in Taiwan application No. 112101144.

* cited by examiner

COOLING PIPE AND COOLING ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 112101144 filed in Taiwan, R.O.C. on Jan. 11, 2023, the entire contents of which are hereby incorporated by reference.

TECHNICAL FIELD

The disclosure relates to a cooling pipe, more particularly to a cooling pipe and a cooling assembly and an electronic device including the same.

BACKGROUND

As technology progresses, an electronic device or an electronic apparatus, such as a notebook computer, a desktop computer or a server, has become an indispensable part of daily life. Moreover, with the development of IoT and big data, the performance and the specification of the electronic device is required to be enhanced to deal with the rapidly growing data amounts. Therefore, not only the processors are required to be cooled, but also other relevant electronic modules may have heat dissipation requirements due to the enhancement of the specification.

Regarding memories, the thermal design power of the memories is approximately up to 20 watts. A server casing may equip at least dozens of the memories of this specification. Therefore, when the server is in operation, the memories may generate a huge amount of heat. Recently, some high-specification memories may be provided with power management integrated circuits (i.e., PMIC) thereon. If the memories are not effectively or efficiently cooled, the operations of the memories and PMIC may be adversely affected, which reduces the stability, performance or service life of the memories.

Based on the heat dissipation issue caused by the increasing of thermal design power of the electronic modules, liquid cooling known as a more effective solution compared to air cooling is attracting attention and becomes a trend of electronics industry.

For example, referring to FIGS. 1 and 2, which show a liquid cooling module for memories. As shown, the memories 8 are arranged side by side on a circuit board P and are spaced apart from one another by a suitable distance, and the memories 8 are fixed on the circuit board P via latches 83. Therefore, there is a long and narrow gap formed between adjacent two memories, thereby causing heat accumulation issue. In order to solve this issue, two opposite sides of one memory 8 may be provided with two cooling pipes 71, and one thermally conductive plate 73 may be provided between the memory 8 and one of the cooling pipes 71 so as to transmit heat generated by the memory 8 to the cooling pipes 71 via the thermally conductive plates 73.

Since the gap between adjacent two memories 8 are long and narrow, for the purpose of easy installation, the thermally conductive plates 73 are adhered on the memory 8 in advance, and then the memory 8 and the thermally conductive plates 73 adhered thereon are installed between the two cooling pipes 71. However, as shown in FIG. 1, there are ICs 81 provided on two opposite surfaces of the memory 8, such that surfaces of the thermally conductive plates 73 on the memory 8 become uneven, which causes the surfaces of the thermally conductive plates 73 are unable to entirely contact the cooling pipes 71, thereby forming air gaps G between the thermally conductive plates 73 and the cooling pipes 71, which increases an overall thermal resistance. In other words, the thermally conductive plates 73 and the cooling pipes 71 do not entirely contact each other due to the irregular surfaces of the memory 8, which reduces the heat dissipation efficiency of the cooling pipes 71 to the memory 8. On the other hand, in order to enable the thermally conductive plates 73 to tightly contact the cooling pipes 71, as shown in FIG. 2, the thermally conductive plates 73 adhered on the memory 8 generally have thicknesses to interfere with the cooling pipes 71, but it is troublesome for the installations, maintenances, or replacements of the memory 8, and the ICs 81 may be damaged during the aforementioned processes.

SUMMARY

Accordingly, the disclosure is to provide a cooling pipe and a cooling assembly and an electronic device including the same which are capable of solving the issues generated by the conventional liquid cooling module.

One embodiment of the disclosure provides a cooling assembly. The cooling assembly is configured for at least one electronic module. The cooling assembly includes at least one thermally conductive plate and at least one cooling pipe. The thermally conductive plate is configured to be attached on one surface of the electronic module. The cooling pipe is configured to be in thermal contact with one side of the thermally conductive plate located farther away from the electronic module. The cooling pipe comprises a pipe wall, and the pipe wall surrounds and forms a fluid channel. The pipe wall of the at least one cooling pipe has a thermally conductive characteristic, and the pipe wall of the at least one cooling pipe is elastically deformable in response to a pressure variation in the fluid channel.

Another embodiment of the disclosure provides a cooling pipe. The cooling pipe is configured to be in thermal contact with one side of an electronic module. The cooling pipe includes a pipe wall. The pipe wall surrounds and forms a fluid channel, an inlet and an outlet, and the inlet and the outlet are respectively in fluid communication with two ends of the fluid channel. The pipe wall has a thermally conductive characteristic, and the pipe wall is elastically deformable in response to a pressure variation in the fluid channel.

Still another embodiment of the disclosure provides an electronic device. The electronic device includes a casing, a circuit board, an electronic module and a cooling pipe. The circuit board is disposed on the casing. The electronic module is removably disposed on the circuit board. The cooling pipe includes a pipe wall in thermal contact with one side of the electronic module and surrounding and forming a fluid channel. The pipe wall has a thermally conductive characteristic and is elastically deformable in response to a pressure variation in the fluid channel.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 3:
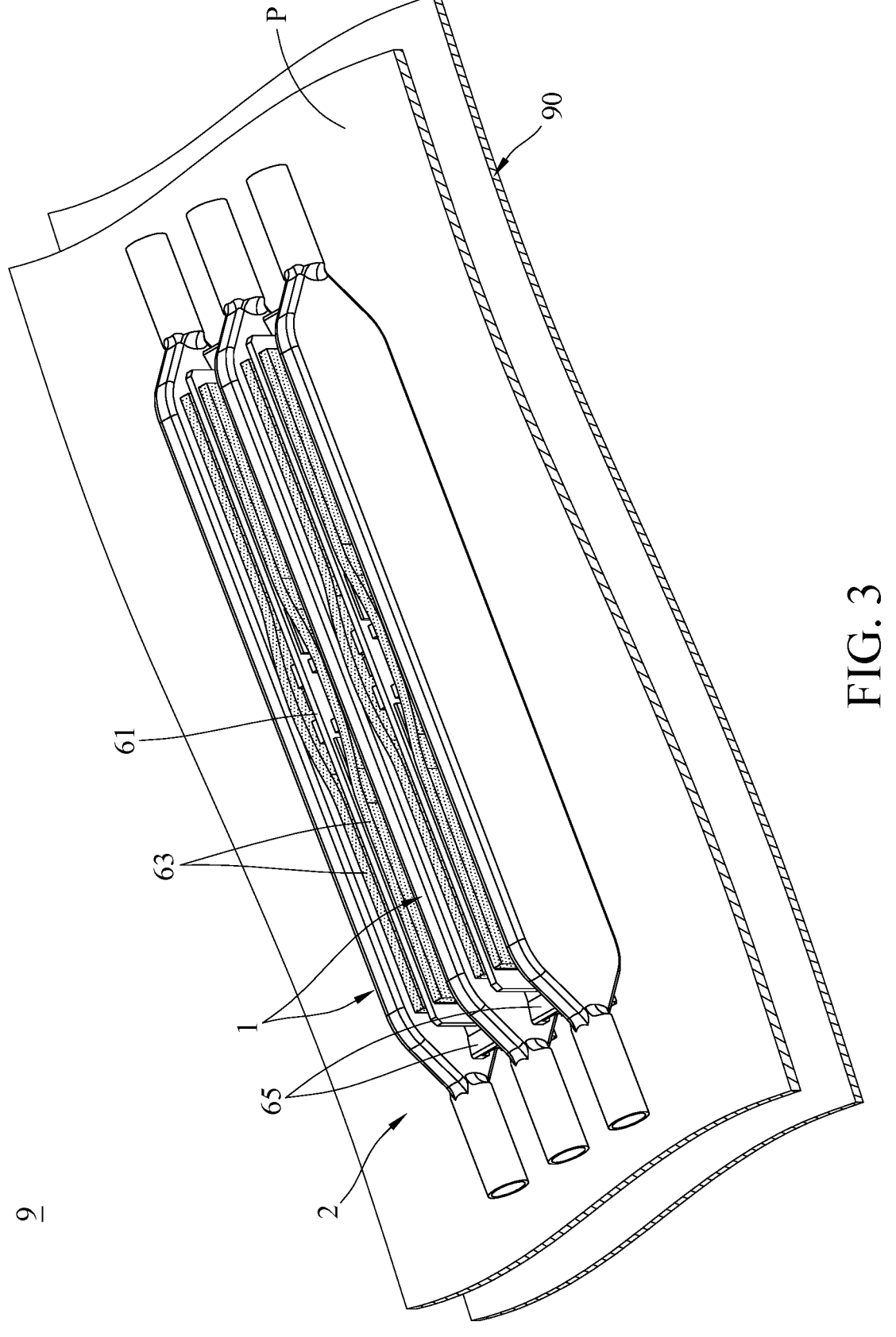
FIG. 3 is a partial perspective view of an electronic device and a cooling assembly applied thereto according to one embodiment of the disclosure.
Figure 4:
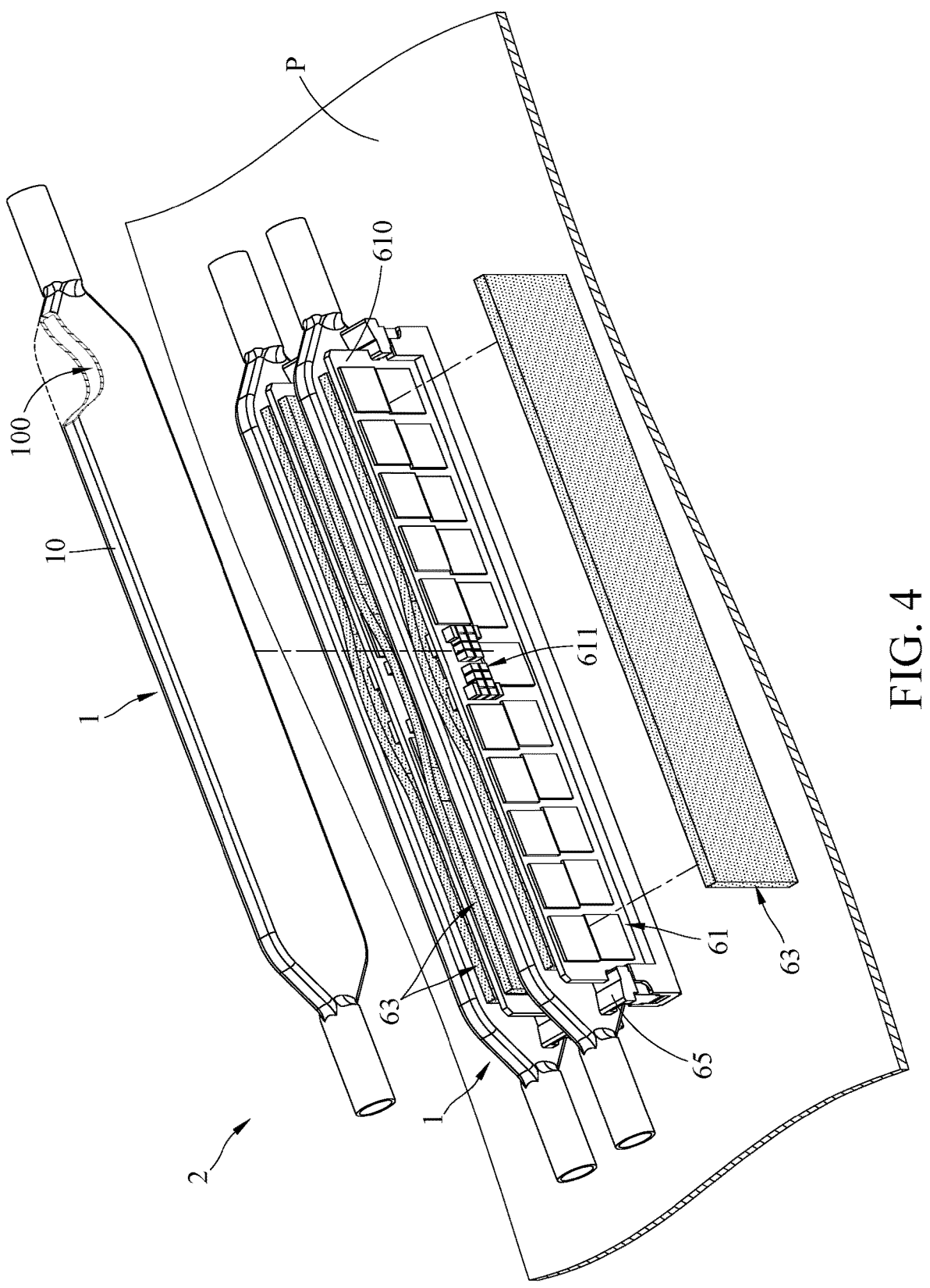
FIG. 4 is an exploded view of the electronic device and the cooling assembly applied thereto according to one embodiment of the disclosure.
Figure 5:
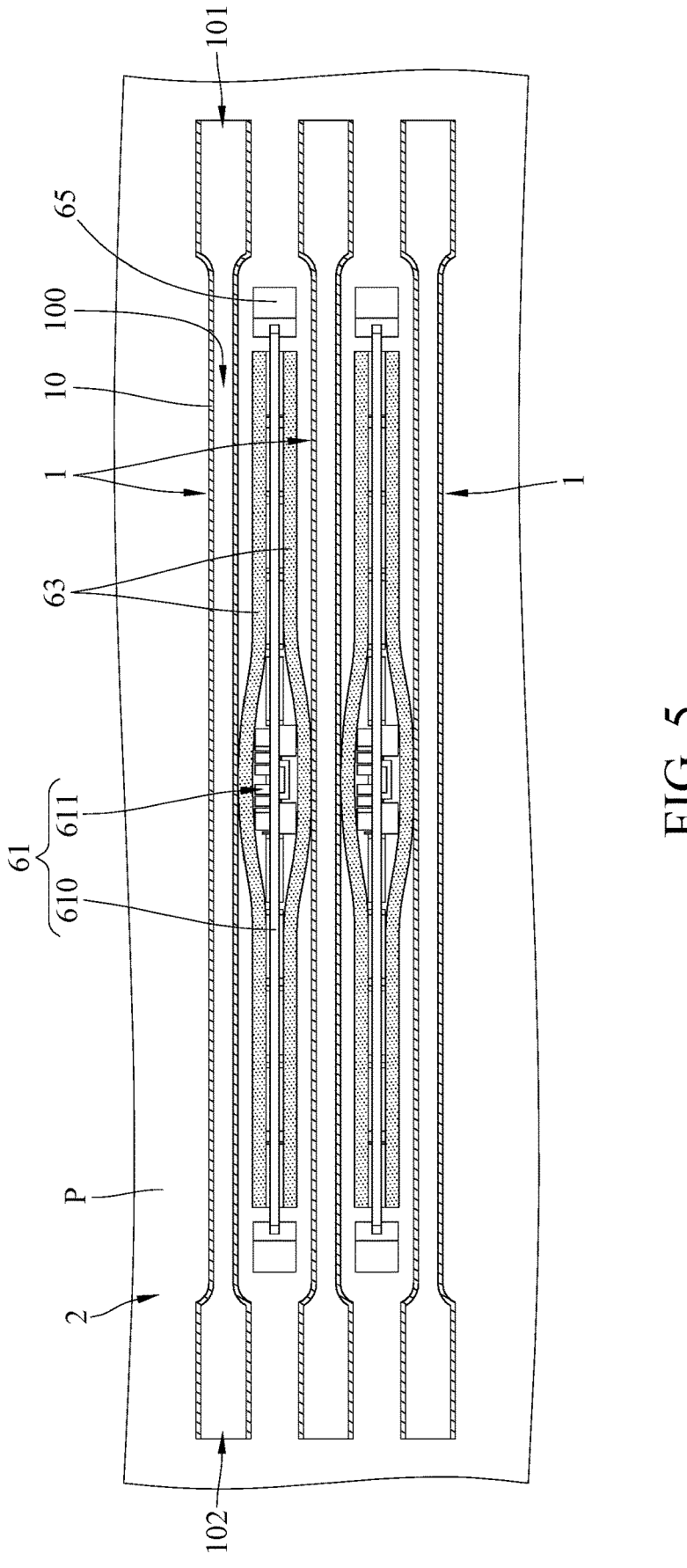
FIG. 5 is a top view of the electronic device and the cooling assembly applied thereto according to one embodiment of the disclosure.

Firstly, refer to FIGS. 3 to 5. One embodiment of the disclosure provides an electronic device 9. The electronic device 9 may be a server, a host of a desktop computer, a laptop computer or a part of one of the aforementioned devices, but the disclosure is not limited thereto. The electronic device 9 may include a casing 90, and the casing 90 is configured to accommodate or support a circuit board P and a cooling assembly 2. In order to clearly show the cooling assembly 2, the casing 90 and the circuit board P are partially depicted and shown by simple lines in figures. The cooling assembly 2 may be disposed on the circuit board P and may include one or more cooling pipes 1. The cooling pipes 1 are configured to be in thermal contact with one or more electronic modules 61 for cooling the electronic module(s) 61. The electronic module 61 may be a memory or another module which is removably disposed on (or removably and electrically connected to) the circuit board P and may generate heat during operation, but the disclosure is not limited thereto. As shown in FIG. 3 or FIG. 4, each of the electronic modules 61 may be fixed on the circuit board P via one pair of latches 65, such that the electronic modules 61 are arranged side by side and spaced apart from one another on the circuit board P. The latches 65 may be any components or mechanisms configured to fix a plate portion 610 of the electronic module 61 on the circuit board P, but the latches 65 are optional components, and the disclosure is not limited thereto. The circuit board P may be any circuit structure configured for the computer host and the server to enable the electronic module 61 to be installed thereon, but the disclosure is not limited thereto.

Any desired electronic components may be disposed on and protrudes from one or two surfaces of the electronic module 61. For example, at least one electronic component 611 may be disposed on and protrude from one or two surfaces of the electronic module 61.

Specifically, the electronic components 611 may be disposed on and protrude from one or two surfaces of the plate portion 610 of the electronic module 61. The said plate portion 610 is a portion of the electronic module 61 which supports the electronic components 611 or other structures. The electronic components 611 are electronic parts which are disposed on at least one of two opposite surfaces of the plate portion 610 via any suitable means, such that an uneven profile is formed on at least one of the two opposite surfaces of the electronic module 61. The electronic components 611 may be power management integrated circuits (i.e., PMIC), but the disclosure is not limited thereto. Note that other desired electronic components may be disposed on the plate portion 610 of the electronic module 61 according to actual requirements, and the disclosure is not limited thereto. For the purpose of illustration, the electronic modules 61 are shown by simple lines, and the size ratios of the electronic components 611 thereon may be slightly enlarged in figures.

Optionally, one thermally conductive plate 63 may be attached on at least one of the two opposite surfaces of the electronic module 61. Specifically, the thermally conductive plate 63 may be disposed on at least one of the two opposite surfaces of the plate portion 610 so as to be in thermal contact with and covers the plate portion 610 and the electronic components 611 on the plate portion 610. The said thermally conductive plate 63 is made of any suitable materials which have desired flexibility and thermal conductivity. In addition, optionally, the material of the thermally conductive plate 63 may have adhesion relative to the surfaces of the plate portion 610 and the electronic components 611 for helping the thermally conductive plate 63 to be attached on the electronic module 61, but the disclosure is not limited thereto. Note that the term "thermal contact" described herein may represent that objects or structures directly contact each other to transmit heat, or another intervening object disposed therebetween to indirectly transmit heat unless otherwise are specified.

Furthermore, as shown in FIG. 5, since the electronic components 611 form the uneven profile on the surface of the electronic module 61, the thermally conductive plate 63 attached on the electronic module 61 may therefore have an uneven profile. The term "uneven profile" described herein generally represents that a surface of an object is uneven and non-flat so as to have ups and downs shape or have a protruding part or recessed part. Note that the thermally conductive plate 63 may cover or contact the surfaces of the plate portion 610 and the electronic components 611 as much as possible via the flexibility and the elasticity of the material of the thermally conductive plate 63, such that there may be no air gap formed between the thermally conductive plate 63 and the surfaces of the electronic modules 61, or there may be a neglectable air gap formed between the thermally conductive plate 63 and the surfaces of the electronic modules 61; that is, the thermal resistance generated from such air gap can be neglected. In this case, the heat generated from the electronic modules 61 (e.g., the electronic component 611) during operation can be directly transmitted to the thermally conductive plate 63.

The cooling pipe 1 may be in a flat plate shape so as to be suitable to be disposed on the thermally conductive plate 63 on the electronic module 61. For example, the cooling pipe 1 may be disposed on one side (or surface) of the thermally conductive plate 63 located farther away from the electronic module 61. The cooling pipe 1 may be made of a material having a desired thermal conductivity. Therefore, the cooling pipe 1 is configured to be in thermal contact with the thermally conductive plate 63, such that the cooling pipe 1 may be indirectly in thermal contact with the plate portion 610 and the electronic components 611 of the electronic module 61 via the thermally conductive plate 63 for absorbing heat transmitted from the electronic module 61 to the thermally conductive plate 63. However, the thermally conductive plate 63 is optional structure; for example, the cooling pipe may be directly in thermal contact with the electronic module in some other embodiments so as to omit the aforementioned thermally conductive plate.

Specifically, the cooling pipe 1 may be a hollow pipe so as to allow a suitable coolant to flow therein. The said coolant may be any working fluid generally applicable in the heat dissipation field or helping to improve the heat dissipation efficiency, but the disclosure is not limited thereto. In specific, as shown in FIGS. 4 to 5, the cooling pipe 1 may include a pipe wall 10, a fluid channel 100 surrounded and formed by the pipe wall 10, an inlet 101 and an outlet 102 which are respectively located at two ends of the fluid channel 100. The pipe wall 10 is referred to a physical part of the cooling pipe 1, and a material of the pipe wall 10 has a thermal conductive characteristic, or the pipe wall 10 is made of a material having a desired thermal conductivity. The fluid channel 100 is referred to a space of the cooling pipe 1 surrounded and defined by the pipe wall 10 and allowing the coolant (e.g., the coolant 7 shown in the later FIG. 6) to flow therethrough. The inlet 101 and the outlet 102 are respectively located at two opposite ends of the fluid channel 100 and are in fluid communication with the fluid channel 100. The inlet 101 is referred to an end or a part of the cooling pipe 1 to receive the coolant so as to allow the coolant to flow into the fluid channel 100 of the cooling pipe 1. The outlet 102 is another end or another part of the cooling pipe 1 to discharge the coolant so as to allow the coolant to flow out of the fluid channel 100 of the cooling pipe 1. The term "fluid communication" described herein generally represents that gas and/or liquid can flow through passages, fluid channels, spaces, areas and/or openings.

Note that the inlet 101 may be directly in fluid communication with a coolant source (not shown), or the inlet 101 may be indirectly in fluid communication with the coolant source via one or more tubes, such that the coolant can flow into the fluid channel 100 of the cooling pipe 1 from the inlet 101. The outlet 102 may be directly in fluid communication with a radiator (not shown), or the outlet 102 may be indirectly in fluid communication with the radiator via one or more tubes, such that the coolant can flow out of the fluid channel 100 of the cooling pipe 1 and be cooled by the radiator, and then flow back to the cooling assembly 2. In another embodiment, the outlet 102 may be in fluid communication with the inlet 101 of another cooling pipe 1.

In addition, the material and the thickness of the pipe wall 10 of the cooling pipe 1 enable the cooling pipe 1 to have a characteristic of elastic deformation in response to a pressure of the coolant in the fluid channel 100; in other words, the material and the thickness of the pipe wall 10 of the cooling pipe 1 enable the cooling pipe 1 has a characteristic of elastic inflation due to the inner pressure. The term "elastic deformation" or "elastic inflation" represents that the shape of the pipe wall 10 of the cooling pipe 1 is correspondingly changed when the pressure of the coolant in the fluid channel 100 increases or decreases. Therefore, when the pressure is released, the pipe wall 10 recovers to its original shape. As a result, compared with a conventional cooling pipe made of copper or an alloy thereof, the cooling pipe 1 of this embodiment has a significant characteristic of elastic deformation in response to the pressure. For example, the pipe wall 10 of the cooling pipe 1 is made of a material, such as high-density polyethylene (i.e., HDPE). Furthermore, in some embodiments, metal powder may be added into the pipe wall 10 of the cooling pipe 1 for increasing the thermal conductivity and the flexibility of the pipe wall 10 of the cooling pipe 1, thereby increasing the heat dissipation efficiency of the cooling pipe 1 to the electronic module 61.

Figure 6:
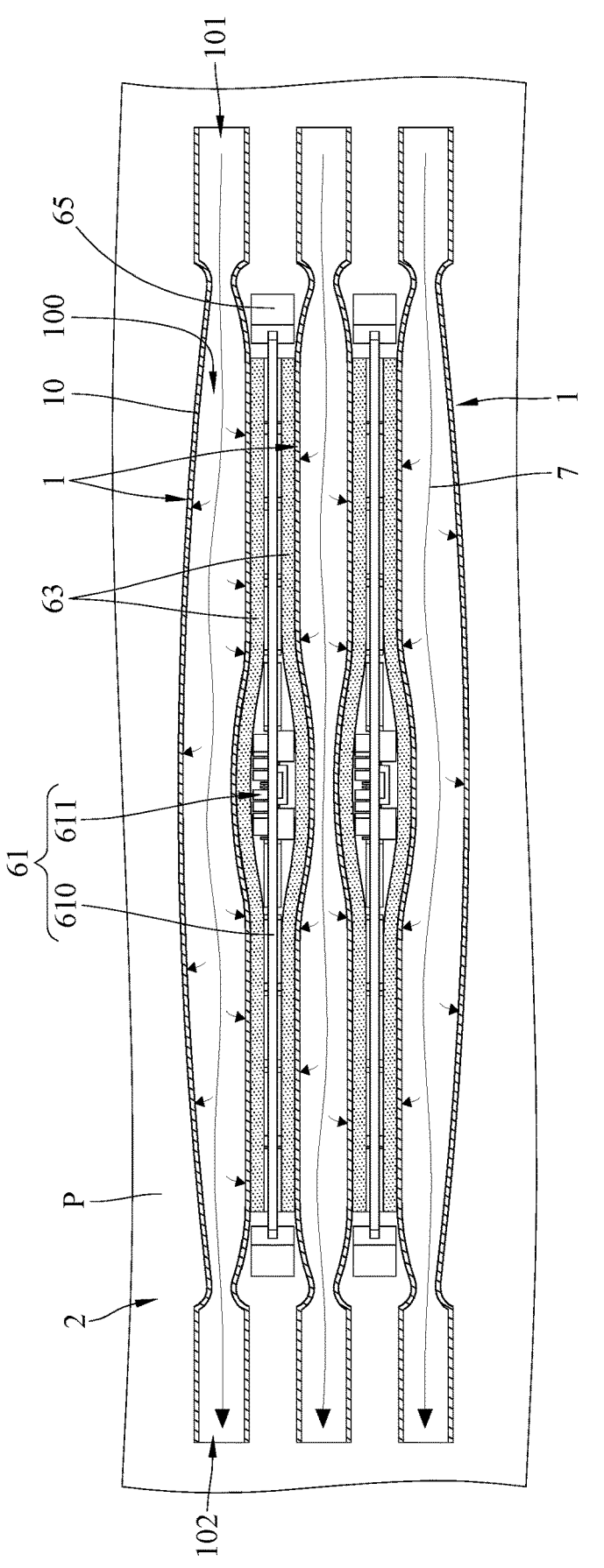
FIG. 6 is a top view of the electronic device and the cooling assembly in FIG. 5 when cooling pipes of the cooling assembly are in operation.

Specifically, refer to FIG. 6 along with FIG. 5, where FIG. 6 is a cross-sectional view of the cooling pipe 1 showing the relationship among the cooling pipe 1, the thermally conductive plate 63 and the electronic module 61 when the coolant flows through the cooling pipe 1 of the cooling assembly 2. Firstly, as shown in FIG. 5, when the cooling assembly 2 is not in operation (e.g., when the coolant 7 does not flow through the fluid channel 100 of the cooling pipe 1), the pipe wall 10 of the cooling pipe 1 may be maintained in its original shape. Then, as shown in FIG. 6, when the cooling assembly 2 is in operation to drive the coolant 7 to flow through the fluid channel 100 of the cooling pipe 1, the pipe wall 10 of the cooling pipe 1 may be elastically inflated and deformed in response to the pressure of the flowing coolant 7 (e.g., indicated by arrows), which forces an outer surface of the pipe wall 10 of the cooling pipe 1 gradually and tightly contacts the surface of the thermally conductive plate 63 located farther away from the electronic module 61. As a result, the pipe wall 10 of the cooling pipe 1 may have a profile matching the thermally conductive plate 63, and thus there may be no air gap formed between the cooling pipe 1 and the thermally conductive plate 63, or there may a neglectable air gap formed between the cooling pipe 1 and the thermally conductive plate 63; that is, the thermal resistance generated from such air gap can be neglected. As mentioned above, it can be understood that when the pressure of the coolant 7 flowing into the fluid channel 100 of the cooling pipe 1 increases, the contact area between the cooling pipe 1 and the thermally conductive plate 63 may also increase; in other words, the pressure in the fluid channel 100 of the cooling pipe 1 is proportional to the contact area between the cooling pipe 1 and the thermally conductive plate 63; that is, the larger pressure in the fluid channel 100 is, the greater contact area between the cooling pipe 1 and the thermally conductive plate 63 is.

In such a case, the thermally conductive plate 63 can be in thermal contact with the cooling pipe 1 with the entire surface thereof, and thus the heat absorbed by the thermally conductive plate 63 from the electronic module 61 can be effectively and directly transmitted to the cooling pipe 1 so as to be taken away by the coolant 7 in the cooling pipe 1. Comparing with the aforementioned FIG. 1, the cooling assembly 2 of this embodiment can significantly reduce or eliminate the thermal resistance produced due to the air gap G formed between the conventional cooling pipe 71 and the memory 8 so as to achieve the desired heat dissipation efficiency of the cooling pipe 1. Moreover, since the cooling pipe 1 only tightly contacts the thermally conductive plate 63 during operation, there is no need to thicken the thermally conductive plate 63 for the thermally conductive plate 63 to interfere with the cooling pipe 1 in advance. Therefore, comparing with the conventional cooling pipe 71 and thermally conductive plate 73 previously shown in FIG. 2, the cooling assembly 2 of this embodiment can facilitate the installation, maintenance or replacement of the electronic module 61 and/or the cooling pipe 1, and can prevent the electronic components 611 of the electronic module 61 from being damaged during the aforementioned processes.

Figure 1:
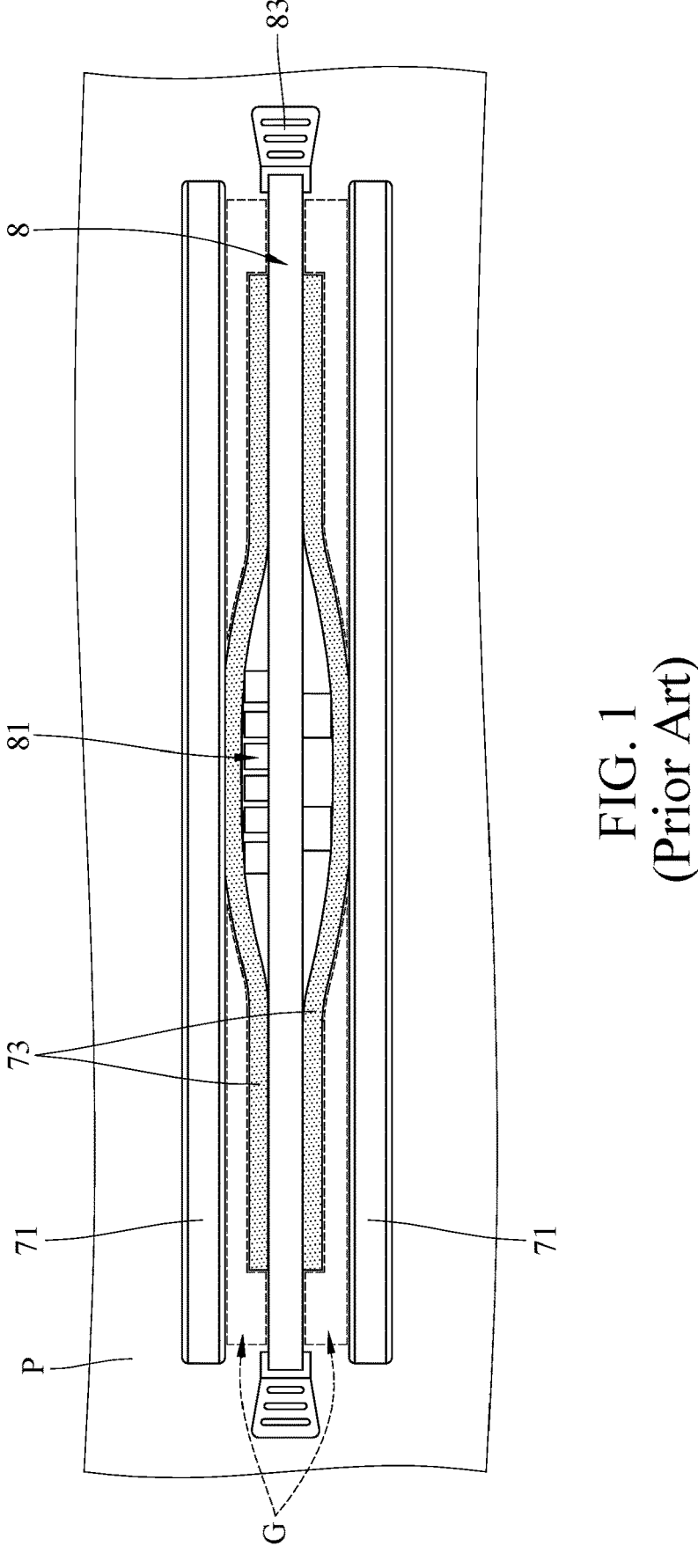
FIG. 1 is a schematic view of a conventional cooling module for a memory of a server.
Figure 2:
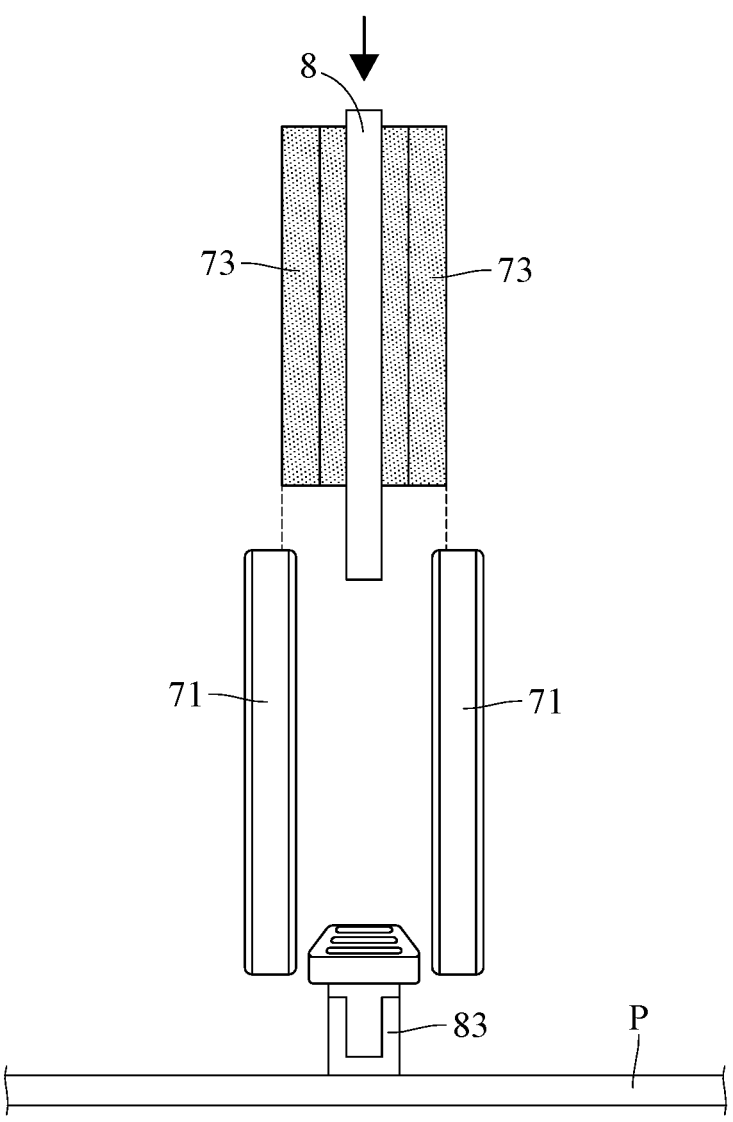
FIG. 2 is a schematic view of an installation of the memory in FIG. 1.

More specifically, as shown in the aforementioned FIGS. 1 and 2, in an area where the air gap G is located, the heat dissipation path of heat from the memory 8 to the coolant in the cooling pipe 71 is sequentially that: the memory 8, the thermally conductive plate 73, the air gap G, the cooling pipe 71 and the coolant. In another area where the cooling pipe 71 and the thermally conductive plate 73 directly contact each other, the heat dissipation path of heat from the memory 8 to the coolant in the cooling pipe 71 is sequentially that: the memory 8, the thermally conductive plate 73, the cooling pipe 71 and the coolant. Accordingly, an equivalent thermal resistance between the coolant in the cooling pipe 71 and the memory 8 is obtained by calculating the thermal resistances of the aforementioned areas in parallel. Although the cooling pipe 71 is made of copper (e.g., having the thermal conductivity of 401 W/m·k), in the case that the thermal conductivity of air is 0.027 W/m·k, the said equivalent thermal resistance may be significantly increased by the influence of the air gap G, thereby adversely affecting the heat dissipation efficiency of the cooling pipe 71 to the memory 8.

In contrast, the cooling pipe 1 of this embodiment can be elastically inflated and deformed in response to the inner pressure so as to tightly contact the surface of the thermally conductive plate 63, such that the influence of the thermal resistance of air is approximately non-existed and thus can be neglected. Therefore, the equivalent thermal resistance between the coolant 7 in the cooling pipe 1 and the electronic module 61 can be obtained by merely considering the thermal resistance of the pipe wall 10 of the cooling pipe 1 and the thermally conductive plate 63 without further considering the influence of air. As a result, the heat dissipation efficiency of the cooling pipe 1 to the electronic module 61 can be significantly improved.

In short, since the cooling pipe 1 has the characteristic of elastic deformation or inflation in response to the pressure produced by the flowing coolant (e.g., the cooling pipe 1 has the characteristic of elastic deformation or inflation in response to the pressure variation in the fluid channel 100 thereof), the shape (or the profile) of the cooling pipe 1 can be actively deformed to fit or match the shape (or the profile) of the adjacent component, which not only increases the contact area between the cooling pipe 1 and the adjacent component, but also reduces the air gap between them, thereby effectively eliminating the influence of the thermal resistance of the air gap to the heat dissipation efficiency.

The above paragraphs introduce one embodiment of the cooling assembly of the disclosure, but the disclosure is not limited thereto. For example, refer to FIGS. 7 to 11, where FIGS. 7 to 11 show the cooling assemblies which are also suitable for the casing and the circuit board. However, for the purpose of illustration, FIGS. 7 to 11 are depicted in a simplified manner.

Figures 7, 8:
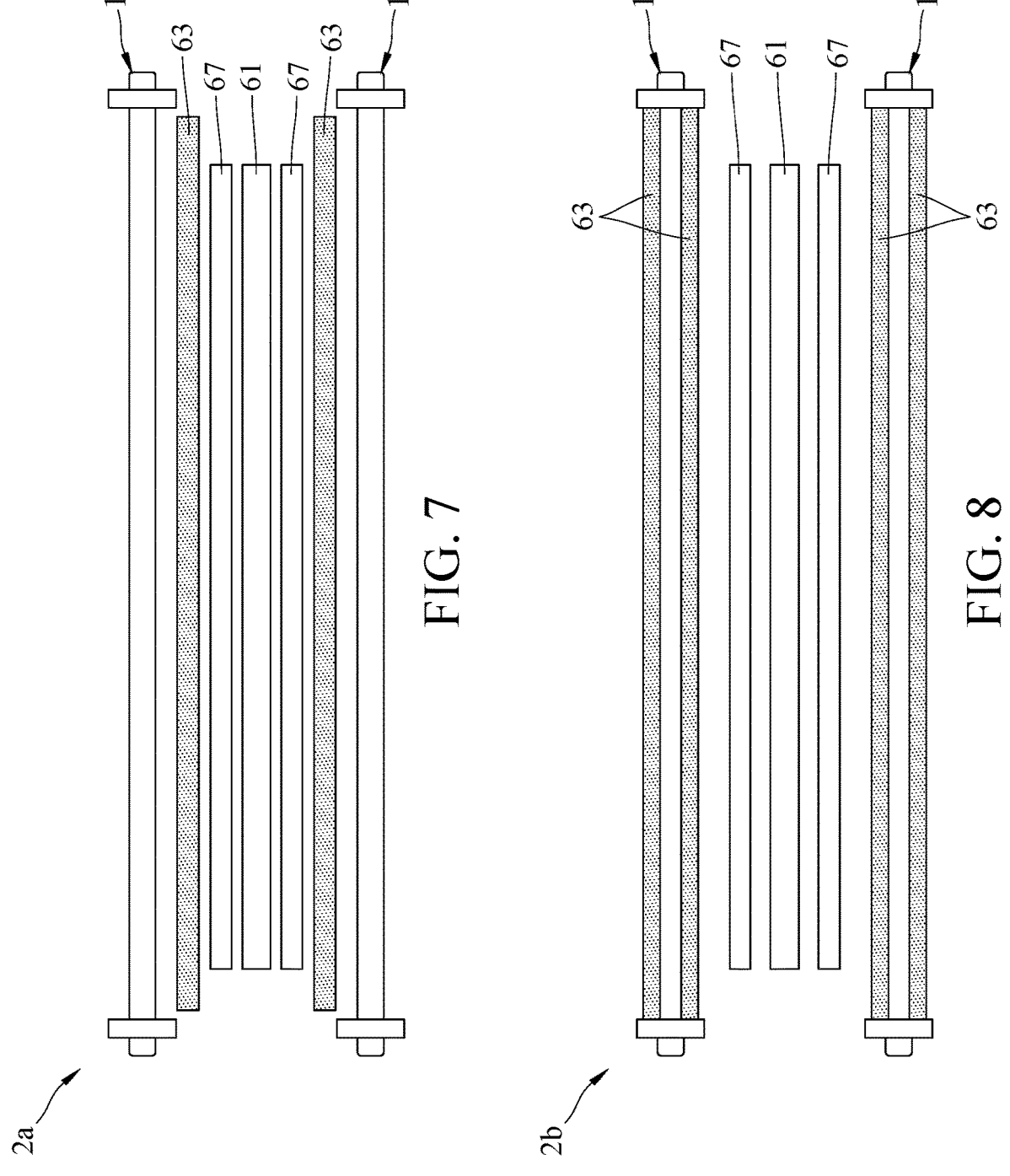
FIG. 7 is a top view of a cooling assembly according to another embodiment of the disclosure.
FIG. 8 is a top view of a cooling assembly according to another embodiment of the disclosure.

Referring to a cooling assembly 2a shown in FIG. 7, a thermally conductive substance 67 may be additionally disposed between the cooling pipe 1 and the thermally conductive plate 63 or between the thermally conductive plate 63 and the electronic module 61. The said thermally conductive substance 67 may be a substance or component which facilitates the heat dissipation or the heat conduction. For example, the thermally conductive substance 67 may be a heat dissipation gel, but the disclosure is not limited thereto.

Referring to a cooling assembly 2b shown in FIG. 8, the thermally conductive plates 63 may be disposed on the cooling pipe 1 in advance; that is, the cooling pipe 1 and the thermally conductive plates 63 may be integrally formed as one piece in advance.

Figure 9:
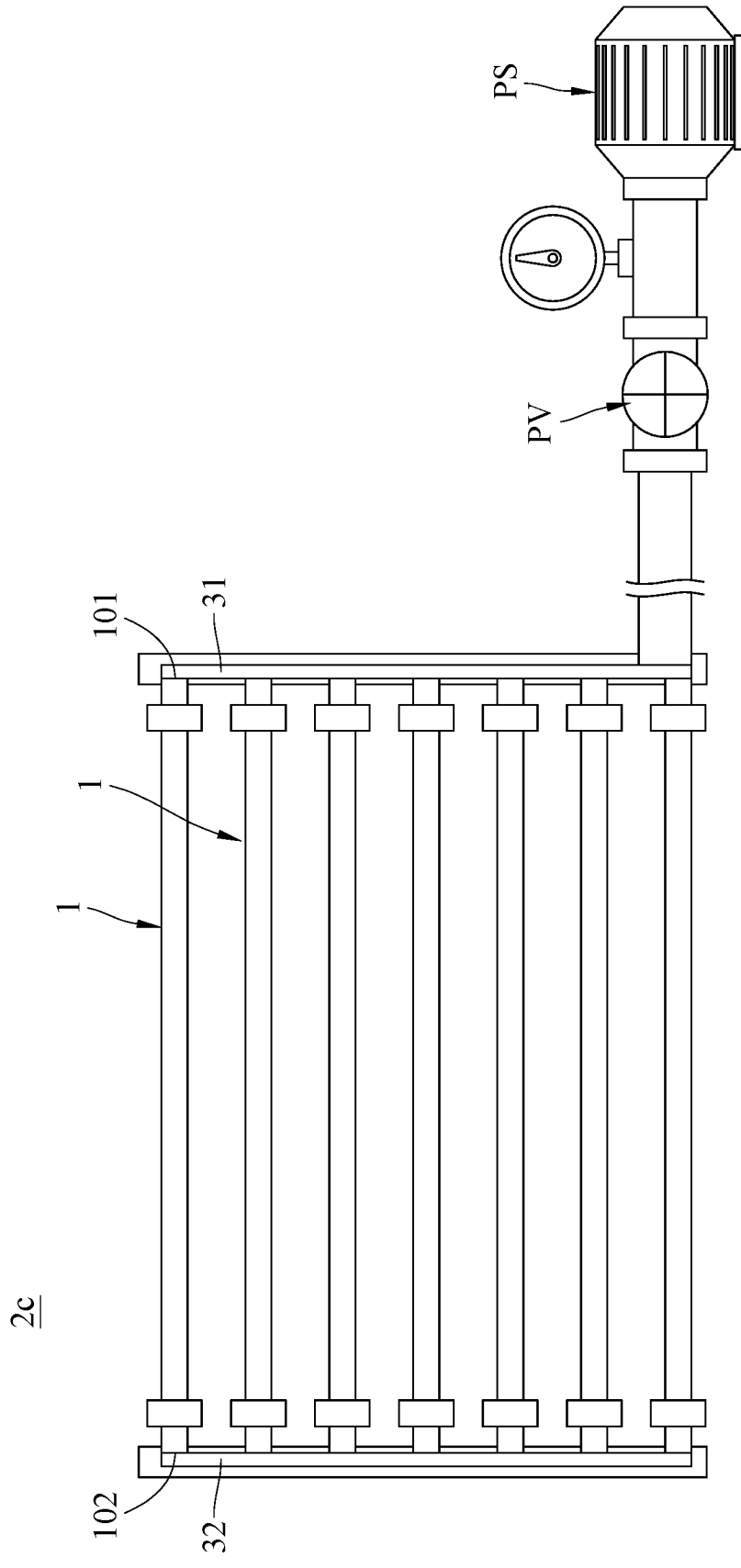
FIG. 9 is a schematic view of a cooling assembly according to another embodiment of the disclosure.

Referring to a cooling assembly 2c shown in FIG. 9, the inlets 101 of the cooling pipes 1 may be together connected to a first connection pipe 31, the outlets 102 of the cooling pipes 1 may be together connected to a second connection pipe 32, and the first connection pipe 31 may be externally connected to a pressure valve PV and a driving motor PS. The term "together connected" herein represents that said multiple objects are all connected to and in fluid communication with a same another object. In such a case, the elastic inflation amount of the cooling pipe 1 or the pressure that the cooling pipe 1 applied to the thermally conductive plate 63 and the electronic module 61 can be adjusted by controlling the driving motor PS and the pressure valve PV, and the contact area between the cooling pipe 1 and the thermally conductive plate 63 can be flexibly adjusted, such that the thermal resistance between the cooling pipe 1 and the electronic module 61 can be flexibly adjusted. Note that the driving motor PS shown herein may be a power source which is also used to drive the coolant to flow in the cooling assembly 2c.

Figure 10:
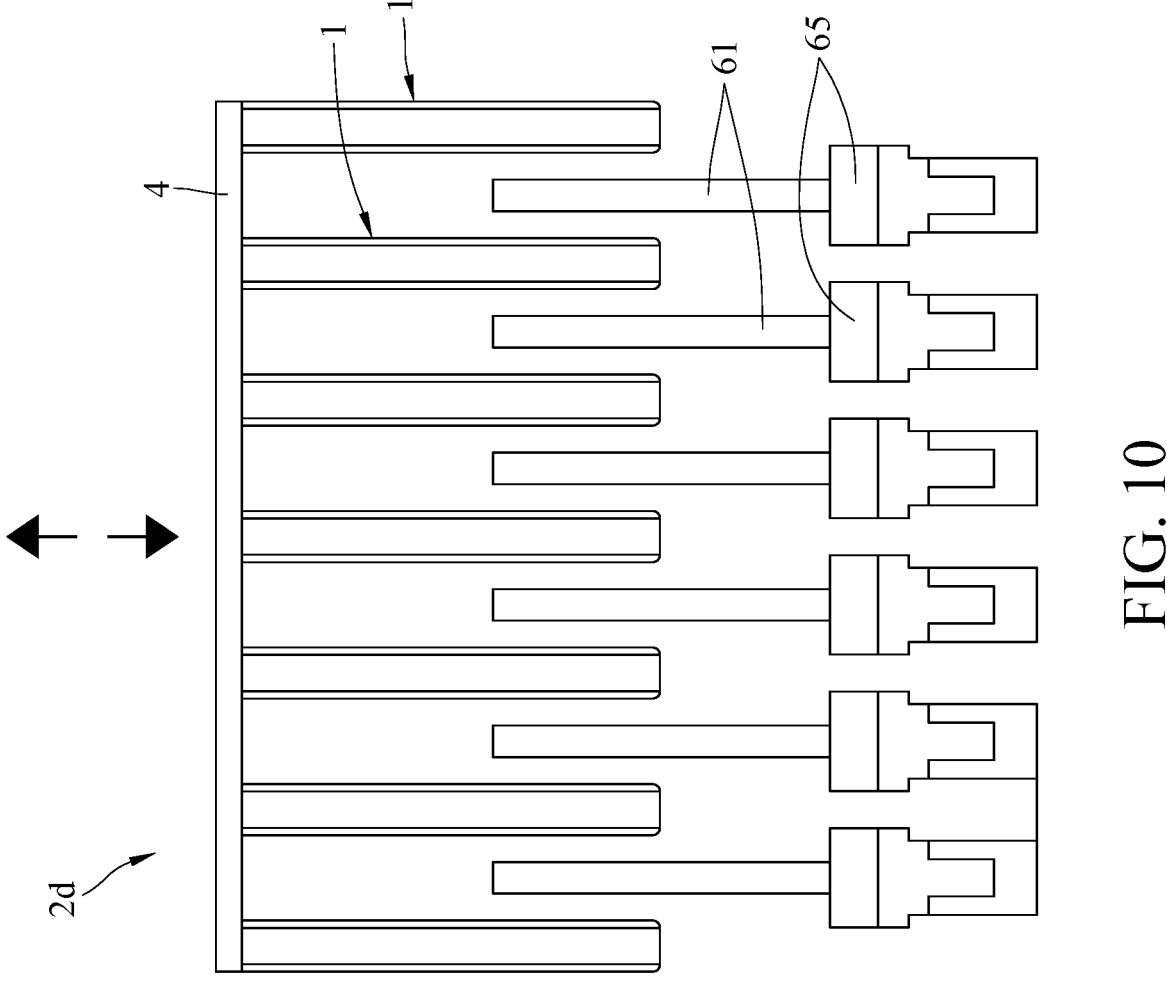
FIG. 10 is a schematic view of an installation of a cooling assembly according to another embodiment of the disclosure.

Referring to a cooling assembly 2d shown in FIG. 10, the cooling pipes 1 may be together connected to a connection component 4, and the connection component 4 may be made of any suitable materials having sufficient structural strength. By doing so, the cooling pipes 1 and the connection component 4 together form a comb structure. In such a case, the distance between one cooling pipe 1 and another can be fixed by connections of the cooling pipes to the connection component 4. As a result, the installations or the removals of the cooling pipes 1 can be achieved simultaneously by holding and moving the connection component 4 (e.g., indicated by arrows).

Figure 11:
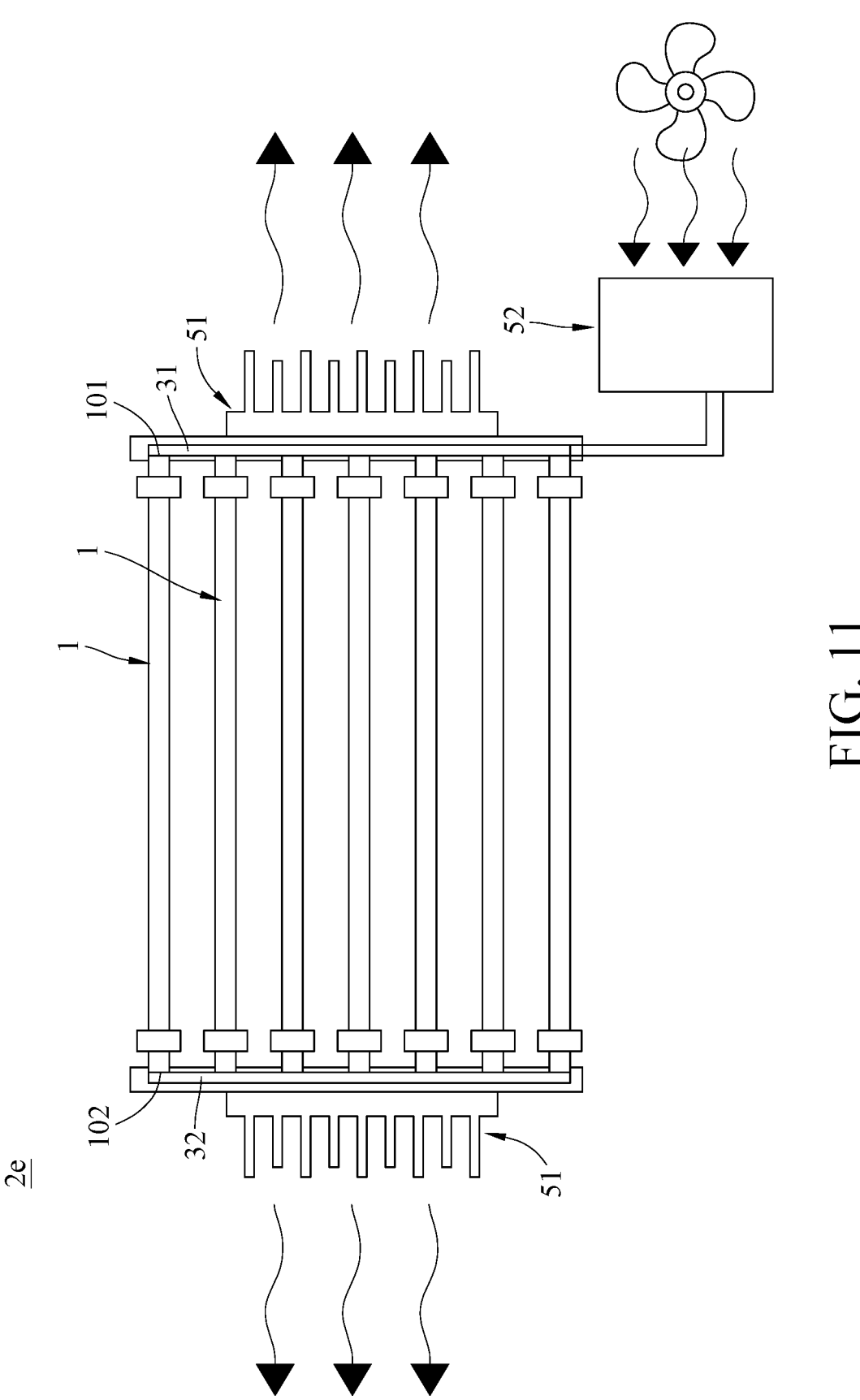
FIG. 11 is a schematic view of a cooling assembly according to another embodiment of the disclosure.

Referring to a cooling assembly 2e shown in FIG. 11, the inlets 101 and the outlets 102 of the cooling pipes 1 may be respectively together connected to the first connection pipe 31 and the second connection pipe 32, and a heat sink 51 may be disposed on or in thermal contact with at least one of the first connection pipe 31 and the second connection pipe 32 for further enhancing the heat dissipation efficiency of the cooling assembly 2e. Moreover, the first connection pipe 31 may be externally connected to a radiator 52 for decreasing the temperature of the coolant flowing into the cooling pipes 11 from the inlets 101, thereby increasing the heat dissipation efficiency of the cooling assembly 2e.

It can be understood that the design, material, size and specification of the cooling pipe can be modified according to actual requirements as long as the cooling pipe can be elastically deformed in response to the inner pressure thereof. For example, in some other embodiments, different portions of the pipe wall of the cooling pipe may be made of materials with different elasticities. For example, one portion of the cooling pipe which is required to be largely deformed may be made of the material with a larger elasticity while another portion of the cooling pipe which is required to be slightly deformed may be made of the material with a smaller elasticity. By doing so, when the cooling pipe is deformed by the inner pressure thereof, the two portions of the cooling pipe made of different materials with different elasticities may have different deformation amounts. Alternatively, in another embodiment, different portions of the pipe wall of the cooling pipe may have different thicknesses. For example, one portion of the cooling pipe which is required to be largely deformed may have a smaller thickness while another portion of the cooling pipe which is required to be slightly deformed may have a larger thickness. By doing so, when the cooling pipe is deformed by the inner pressure thereof, the two portions of the cooling pipe having different thicknesses may have different deformation amounts.

According to the cooling pipe and the cooling assembly and the electronic device including the same as disclosed in the above embodiments, since the cooling pipe has the characteristic of elastic deformation or inflation in response to the inner pressure thereof, the thermal resistance produced due to the air gap formed between the conventional cooling pipe and the electronic module can be significantly reduced or eliminated for achieving desired heat dissipation efficiency, and the installation, maintenance or replacement of the electronic module and the cooling pipe can be facilitated, and the electronic components of the electronic module can be prevented from being damaged during the aforementioned processes.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A cooling assembly, configured for at least one electronic module, comprising:

at least one thermally conductive plate, configured to be attached on one surface of the at least one electronic module, wherein the at least one thermally conductive plate is configured to be flexible such that there is no air gap formed between the at least one thermally conductive plate and surfaces of the at least one electronic module; and at least one cooling pipe, configured to be in thermal contact with one side of the at least one thermally conductive plate located farther away from the at least one electronic module, wherein the at least one cooling pipe comprising a pipe wall, wherein the pipe wall surrounds and forms a fluid channel, and a material of the pipe wall of the at least one cooling pipe comprises high-density polyethylene;

wherein the pipe wall of the at least one cooling pipe has a thermally conductive characteristic, and the pipe wall of the at least one cooling pipe made of high-density polyethylene is repeatedly elastically deformable in response to a pressure variation in the fluid channel;

wherein a contact area between the pipe wall of the at least one cooling pipe and the at least one thermally conductive plate is proportional to a pressure in the fluid channel, and wherein in an expanded state of the pipe wall, the contact area eliminates thermal resistance caused by air gaps.

2. The cooling assembly according to claim 1, wherein the pipe wall surrounds and forms an inlet and an outlet, and the inlet and the outlet are respectively in fluid communication with two ends of the fluid channel.

3. The cooling assembly according to claim 2, further comprising a first connection pipe and a second connection pipe, wherein the at least one cooling pipe comprises a plurality of cooling pipes, inlets of the plurality of cooling pipes are together connected to the first connection pipe, and outlets of the plurality of cooling pipes are together connected to the second connection pipe, and the first connection pipe is externally connected to a driving motor.

4. The cooling assembly according to claim 2, further comprising a first connection pipe and a second connection pipe, wherein the at least one cooling pipe comprises a plurality of cooling pipes, inlets of the plurality of cooling pipes are together connected to the first connection pipe, outlets of the plurality of cooling pipes are together connected to the second connection pipe, and the first connection pipe is externally connected to a radiator.

5. The cooling assembly according to claim 4, further comprising at least one heat sink, wherein the heat sink is disposed on the first connection pipe.

6. The cooling assembly according to claim 5, wherein the at least one heat sink comprises a plurality of heat sinks, and the plurality of heat sinks are respectively disposed on the first connection pipe and the second connection pipe.

7. The cooling assembly according to claim 1, wherein the material of the pipe wall of the at least one cooling pipe comprises metal powder.

8. The cooling assembly according to claim 1, further comprising at least one thermally conductive substance, wherein the at least one thermally conductive substance is in thermal contact with one side of the at least one thermally conductive plate located farther away from the at least one cooling pipe.

9. The cooling assembly according to claim 1, wherein the at least one thermally conductive plate comprises a plurality of thermally conductive plates, and the plurality of thermally conductive plates are respectively fixed to two opposite surfaces of the at least one cooling pipe.

10. The cooling assembly according to claim 1, further comprising a connection component, wherein the at least one cooling pipe comprises a plurality of cooling pipes, and the plurality of cooling pipes are connected to the connection component and spaced apart from one another.

11. An electronic device, comprising:

a casing;

a circuit board, disposed on the casing;

an electronic module, removably disposed on the circuit board;

a thermally conductive plate, configured to be attached on one surface of the electronic module, wherein the thermally conductive plate is configured to be flexible such that there is no air gap formed between the thermally conductive plate and surfaces of the electronic module; and a cooling pipe, comprising a pipe wall in thermal contact with one side of the electronic module and surrounding and forming a fluid channel, wherein a material of the pipe wall of the cooling pipe comprises high-density polyethylene, the pipe wall has a thermally conductive characteristic, and the pipe wall made of high-density polyethylene is repeatedly elastically deformable in response to a pressure variation in the fluid channel;

wherein a contact area between the pipe wall of the cooling pipe and the thermally conductive plate is proportional to a pressure in the fluid channel, and wherein in an expanded state of the pipe wall, the contact area eliminates thermal resistance caused by air gaps.

12. The electronic device according to claim 11, further comprising a thermally conductive plate, wherein the thermally conductive plate is attached on a surface of the electronic module, and the pipe wall of the cooling pipe is in thermal contact with one side of the thermally conductive plate located farther away from the electronic module.

13. The electronic device according to claim 11, wherein the material of the pipe wall of the cooling pipe comprises metal powder.

* * * * *